US012663467B2

(12) United States Patent
Tsao et al.

(10) Patent No.: US 12,663,467 B2
(45) Date of Patent: Jun. 23, 2026

(54) ELECTRICAL TESTING EQUIPMENT

(71) Applicant: Test Research, Inc., Taipei City (TW)

(72) Inventors: Yi Tsao, Taipei City (TW); Hsien Hung Chen, Taipei City (TW); Yi-Hua Pan, Taipei City (TW)

(73) Assignee: Test Research, Inc., Taipei City (TW)

( * ) Notice: Subject to any disclaimer, the term of this patent is extended or adjusted under 35 U.S.C. 154(b) by 180 days.

(21) Appl. No.: 18/674,939

(22) Filed: May 27, 2024

(65) Prior Publication Data

US 2025/0298076 A1     Sep. 25, 2025

(30) Foreign Application Priority Data

Mar. 19, 2024     (TW) ................................. 113202753

(51) Int. Cl.
G01R 31/28 (2006.01)

(52) U.S. Cl.
CPC ................................. G01R 31/2893 (2013.01)

(58) Field of Classification Search
None
See application file for complete search history.

(56) References Cited

U.S. PATENT DOCUMENTS

| | | | |
|---|---|---|---|
| 6,739,449 B2 | 5/2004 | Mang et al. | |
| 2008/0224723 A1* | 9/2008 | Washio | .............. G01R 31/2891 |
| | | | 324/758.01 |
| 2010/0001751 A1* | 1/2010 | Akaike | .............. G01R 31/2893 |
| | | | 324/757.01 |

FOREIGN PATENT DOCUMENTS

| | | |
|---|---|---|
| CN | 103234743 A | 8/2013 |
| CN | 216888656 U | 7/2022 |
| TW | 201530168 A | 8/2015 |
| TW | 202525582 A | 7/2025 |

* cited by examiner

*Primary Examiner* — Jas A Sanghera
(74) *Attorney, Agent, or Firm* — CKC & Partners Co., LLC

(57) ABSTRACT

An electrical testing equipment includes a machine, a pair of conveyor rails and a first moving device. The machine has a supporting surface. The supporting surface is configured to support a fixture assembly. The conveyor rails are configured to deliver a device under test. The conveyor rails are separated from the supporting surface by a distance. The first moving device is disposed on the machine and connected with the conveyor rails. The first moving device is configured to move the conveyor rails relative to the machine to change the distance.

14 Claims, 5 Drawing Sheets

A-A

110S

110

136

135

120

132

134   132

133

120

131 { 132 133 134 135 136

X

ELECTRICAL TESTING EQUIPMENT

RELATED APPLICATIONS

This application claims priority to Taiwan Application Serial Number 113202753, filed Mar. 19, 2024, which is herein incorporated by reference in its entirety.

BACKGROUND

Technical Field

The present disclosure relates to electrical testing equipment.

Description of Related Art

As the demand for electronic devices has been increasing nowadays, the quality of various components of electronic devices becomes an important issue of the industry. Apart from improving the technology of manufacture of the components, the testing for the components has naturally also become an important part that cannot be ignored.

For example, electrical testing equipment is in general used to test the electrical behavior of electronic components in the industry. In the frequent processes of testing, the measures to improve the testing efficiency and decrease the testing cost are undoubtedly important issues which the industry highly concerns.

SUMMARY

A technical aspect of the present disclosure is to provide an electrical testing equipment, which can increase the efficiency to place the fixture assembly therein and avoid the chance of misplacement occurred in general practice of placing the upper fixture after the lower fixture is firstly placed.

According to an embodiment of the present disclosure, an electrical testing equipment includes a machine, a pair of conveyor rails and a first moving device. The machine has a supporting surface. The supporting surface is configured to support a fixture assembly. The conveyor rails are configured to deliver a device under test. The conveyor rails are separated from the supporting surface by a distance. The first moving device is disposed on the machine and connected with the conveyor rails. The first moving device is configured to move the conveyor rails relative to the machine to change the distance.

In one or more embodiments of the present disclosure, the first moving device includes two subsidiary moving devices. The subsidiary moving devices are connected with two opposite ends of each of the conveyor rails and configured to move the conveyor rails relative to the machine to change the distance.

In one or more embodiments of the present disclosure, each of the subsidiary moving devices includes a supporting portion, a driving portion and a moving rod. The conveyor rails are disposed on the supporting portion. The driving portion is connected with the machine. The moving rod is connected between the driving portion and the supporting portion. The driving portion is configured to move the moving rod, such that the supporting portion is moved close to or away from the supporting surface.

In one or more embodiments of the present disclosure, each of the subsidiary moving devices includes at least one fixing portion and at least one guiding rod. The fixing portion is connected with the machine. The guiding rod is connected with the supporting portion and slidably connected with the fixing portion. The guiding rod is parallel with the moving rod.

In one or more embodiments of the present disclosure, a quantity of the guiding rod of each of the subsidiary moving devices is four.

In one or more embodiments of the present disclosure, the fixture assembly has a height. A maximum value of the distance is larger than the height.

In one or more embodiments of the present disclosure, the fixture assembly includes an upper fixture and a lower fixture. The upper fixture is detachably connected with the lower fixture. The lower fixture is located between the upper fixture and the supporting surface. The upper fixture and the lower fixture are configured to sandwich the device under test therebetween.

In one or more embodiments of the present disclosure, the electrical testing equipment further includes a clamping device and a second moving device. The clamping device is configured to clamp the upper fixture. The second moving device is connected with the machine and the clamping device. The second moving device is configured to move the clamping device relative to the machine, such that the clamping device is moved close to or away from the lower fixture.

In one or more embodiments of the present disclosure, the upper fixture includes a fixture body and a plurality of first snapping portions. The first snapping portions are disposed on the fixture body. The clamping device includes a device body and a plurality of second snapping portions. The second snapping portions are movably connected with the device body and configured to snap with the first snapping portions.

In one or more embodiments of the present disclosure, the first moving device is configured to move the conveyor rails perpendicularly relative to the supporting surface.

In one or more embodiments of the present disclosure, the machine has at least one through hole. The through hole is located on the supporting surface. The electrical testing equipment further includes at least one roller assembly and a third moving device. The roller assembly includes a base and a plurality of rollers. The rollers are rotatably connected with the base respectively. The third moving device is disposed on the machine and connected with the base. The third moving device is configured to move the base relative to the machine, such that the rollers at least partially pass through the through hole and protrude out of the supporting surface.

According to an embodiment of the present disclosure, an electrical testing equipment includes a machine, at least one roller assembly and a pair of conveyor rails. The machine has a supporting surface and at least one through hole located on the supporting surface. The roller assembly includes a base and a plurality of rollers. Each of the rollers is connected with the base and configured to rotate about an axis relative to the base. The base is movably connected with the machine such that the rollers can be at least partially protruded out of the supporting surface or retracted into supporting surface through the through hole. The conveyor rails are configured to deliver a device under test. The conveyor rails are movable relative to the supporting surface. Each of the conveyor rails extends along a direction parallel with the axes.

In one or more embodiments of the present disclosure, the electrical testing equipment further includes a first moving device. The first moving device is connected between the machine and the conveyor rails. The first moving device is configured to move the conveyor rails close to or away from the machine.

In one or more embodiments of the present disclosure, the electrical testing equipment further includes a fixture assembly. The fixture assembly is configured to pass between the conveyor rails and supporting surface, and configured to be supported by one of the rollers and the supporting surface. The fixture assembly is further configured to hold the device under test therein.

In one or more embodiments of the present disclosure, the fixture assembly includes an upper vacuum fixture and a lower vacuum fixture. The upper vacuum fixture is detachably connected with the lower vacuum fixture. The lower vacuum fixture is located between the upper vacuum fixture and the supporting vacuum surface. The upper vacuum fixture and the lower vacuum fixture are configured to sandwich the device under test therebetween.

In one or more embodiments of the present disclosure, the electrical testing equipment further includes a clamping device and a second moving device. The clamping device is configured to clamp the upper vacuum fixture. The second moving device is connected with the machine and the clamping device. The second moving device is configured to move the clamping device relative to the machine, such that the clamping device is moved close to or away from the lower vacuum fixture.

In one or more embodiments of the present disclosure, the upper vacuum fixture includes a fixture body and a plurality of first snapping portions. The first snapping portions are disposed on the fixture body. The clamping device includes a device body and a plurality of second snapping portions. The second snapping portions are movably connected with the device body and configured to snap with the first snapping portions.

The above-mentioned embodiments of the present disclosure have at least the following advantages:

(1) When the conveyor rails are moved relative to the machine and the distance between the conveyor rails and the supporting surface reaches the maximum value, the upper fixture and the lower fixture can, in the form of combination as a whole, pass between the conveyor rails and the supporting surface by using a trolley, and be placed on the supporting surface of the machine. Apart from increasing the efficiency to place the fixture assembly to the electrical testing equipment, the chance of misplacement occurred in general practice of placing the upper fixture after the lower fixture is firstly placed can be avoided.

(2) When placing the fixture assembly to the electrical testing equipment, the fixture assembly is firstly supported by the rollers protruding out of the supporting surface, and the fixture assembly does not contact with the supporting surface of the machine at this point. Under this condition, even if the fixture assembly including the upper fixture and the lower fixture has a relatively heavier weight, through the rotation of the rollers, a user can still easily push the fixture assembly to an appropriate position in the electrical testing equipment.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
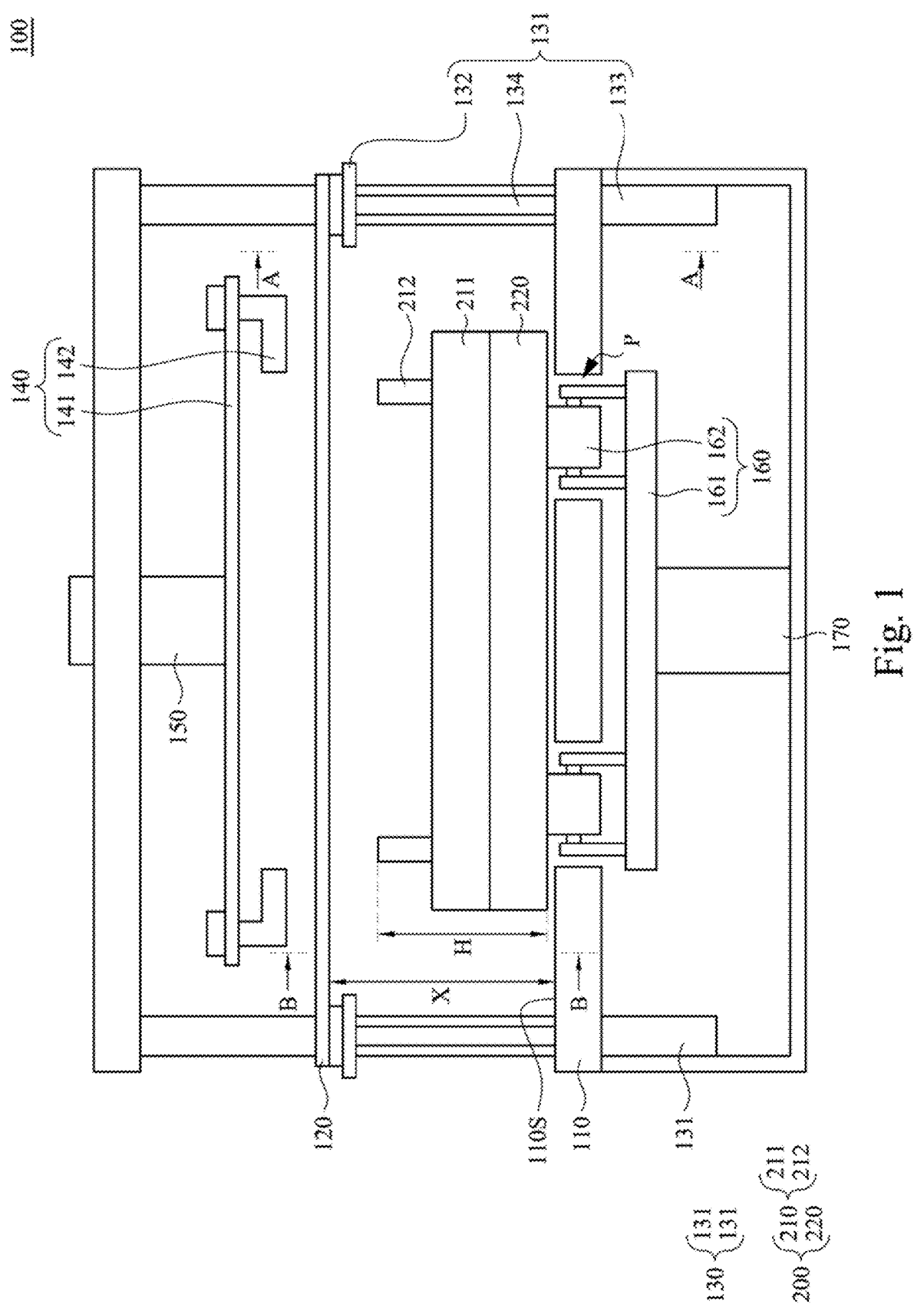
FIG. 1 is a front view of an electrical testing equipment according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
FIG. 2 is a sectional view along the sectional line A-A of FIG. 1.
Figure 2:

Reference is made to FIGS. 1-2. FIG. 1 is a front view of an electrical testing equipment 100 according to an embodiment of the present disclosure. FIG. 2 is a sectional view along the sectional line A-A of FIG. 1. In this embodiment, as shown in FIGS. 1-2, an electrical testing equipment 100 includes a machine 110, a pair of conveyor rails 120 and a first moving device 130. The machine 110 has a supporting surface 110S. The supporting surface 110S is configured to support a fixture assembly 200. The conveyor rails 120 are configured to deliver a device under test 300 (please see FIG. 5 for the device under test 300). The conveyor rails 120 are separated from the supporting surface 110S by a distance X. The first moving device 130 is disposed on the machine 110 and connected with the conveyor rails 120. The first moving device 130 is configured to move the conveyor rails 120 relative to the machine 110 to change the distance X. In practice, the first moving device 130 is configured to move the conveyor rails 120 perpendicularly relative to the supporting surface 110S.

To be specific, the fixture assembly 200 has a height H. In this embodiment, the maximum value of the distance X between the conveyor rails 120 and the supporting surface 110S is larger than the height H of the fixture assembly 200. In other words, when the conveyor rails 120 are moved relative to the machine 110 and the distance X between the conveyor rails 120 and the supporting surface 110S reaches the maximum value, as shown in FIG. 1, the fixture assembly 200 can pass between the conveyor rails 120 and the supporting surface 110S.

In addition, as shown in FIG. 1, the fixture assembly 200 includes an upper fixture 210 and a lower fixture 220. The upper fixture 210 is detachably connected with the lower fixture 220. The lower fixture 220 is located between the upper fixture 210 and the supporting surface 110S. The upper fixture 210 and the lower fixture 220 are configured to sandwich the device under test 300 therebetween. In other words, when the conveyor rails 120 are moved relative to the machine 110 and the distance X between the conveyor rails 120 and the supporting surface 110S reaches the maximum value, the upper fixture 210 and the lower fixture 220 can, in the form of combination as a whole, pass between the conveyor rails 120 and the supporting surface 110S by using a trolley (not shown), and be placed on the supporting surface 110S of the machine 110. Apart from increasing the efficiency to place the fixture assembly 200 to the electrical testing equipment 100, the chance of misplacement occurred in general practice of placing the upper fixture 210 after the lower fixture 220 is firstly placed can be avoided.

Moreover, as shown in FIG. 1, the first moving device 130 includes two subsidiary moving devices 131. The subsidiary moving devices 131 are connected with two opposite ends of each of the conveyor rails 120. The subsidiary moving devices 131 are configured to move the conveyor rails 120 perpendicularly relative to the machine 110 to change the distance X. FIG. 2 shows one of the two subsidiary moving devices 131.

Furthermore, as shown in FIGS. 1-2, each of the subsidiary moving devices 131 includes a supporting portion 132, a driving portion 133 and a moving rod 134. The conveyor rails 120 are disposed on the supporting portion 132. The driving portion 133 is connected with the machine 110. The moving rod 134 is connected between the driving portion 133 and the supporting portion 132. The driving portion 133 is configured to move the moving rod 134, such that the supporting portion 132 is moved close to or away from the supporting surface 110S of the machine 110. This means the supporting portion 132 is configured to move relative to the driving portion 133. In this embodiment, the assembly of the driving portion 133 and the moving rod 134 can be a hydraulic cylinder or a pneumatic cylinder. In other embodiments, the moving rod 134 can be a threaded rod, and the driving portion 133 is configured to rotate the moving rod 134, such that the moving rod 134 is moved relative to the driving portion 133.

To make the movement of the supporting portion 132 relative to the driving portion 133 more stable, in this embodiment, as shown in FIG. 2, each of the subsidiary moving devices 131 further includes at least one fixing portion 135 and at least one guiding rod 136. The fixing portion 135 is connected with the machine 110. The guiding rod 136 is connected with the supporting portion 132 and slidably connected with the fixing portion 135. The guiding rod 136 is parallel with the moving rod 134. Preferably, as shown in FIG. 2, a quantity of the guiding rod 136 of each of the subsidiary moving devices 131 is four. However, this does not intend to limit the present disclosure. For the sake of drawing simplification, the fixing portion 135 and the guiding rod 136 are not shown in other figures.

Figure 3:
FIG. 3 is a sectional view along the sectional line B-B of FIG. 1.
Figure 3:
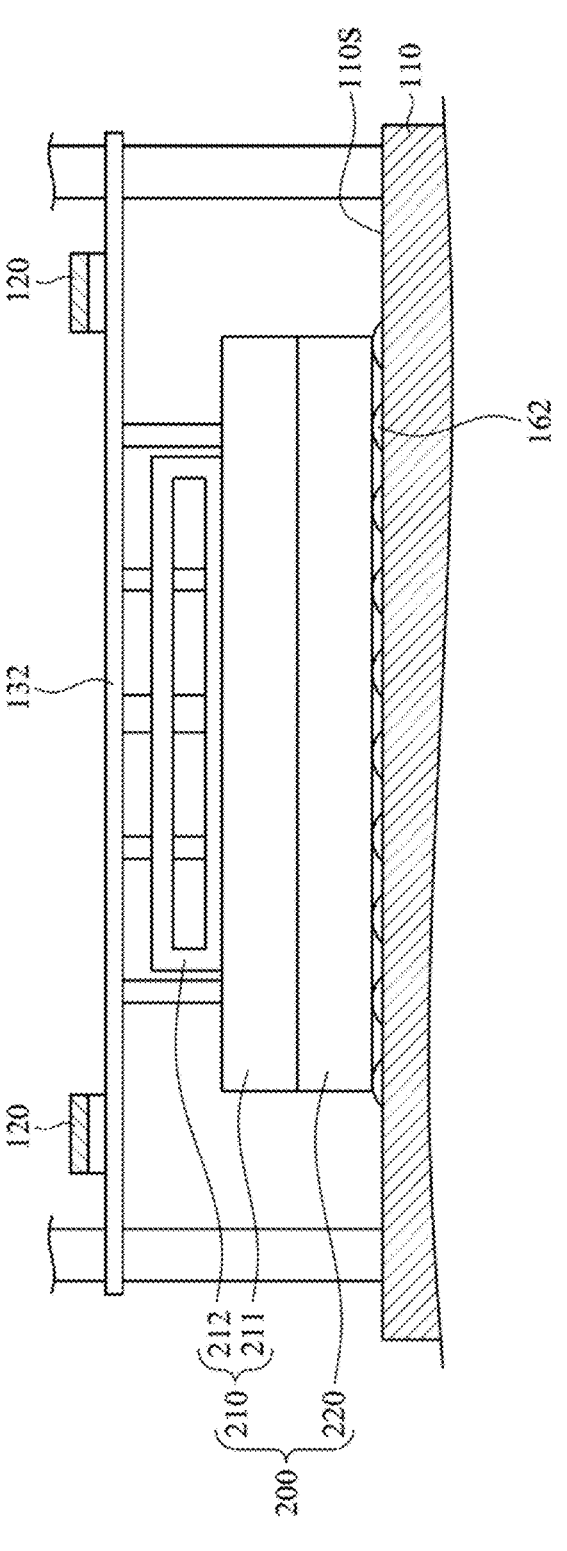

Reference is made to FIG. 3. FIG. 3 is a sectional view along the sectional line B-B of FIG. 1. In this embodiment, as shown in FIGS. 1 and 3, the machine 110 has at least one through hole P (please see FIG. 1 for the through hole P). The through hole P is located on the supporting surface 110S. The electrical testing equipment 100 further includes at least one roller assembly 160 and a third moving device 170. The roller assembly 160 includes a base 161 and a plurality of rollers 162. The rollers 162 are rotatably connected with the base 161 respectively. The third moving device 170 is disposed on the machine 110 and connected with the base 161 of the roller assembly 160. The third moving device 170 is configured to move the base 161 relative to the machine 110, such that the rollers 162 at least partially pass through the through hole P and protrude out of the supporting surface 110S of the machine 110.

In addition, as shown in FIGS. 1 and 3, when placing the fixture assembly 200 to the electrical testing equipment 100, the fixture assembly 200 is firstly supported by the rollers 162 protruding out of the supporting surface 110S, and the fixture assembly 200 does not contact with the supporting surface 110S of the machine 110 at this point. Under this condition, even if the fixture assembly 200 including the upper fixture 210 and the lower fixture 220 has a relatively heavier weight, through the rotation of the rollers 162, a user can still easily push the fixture assembly 200 to an appropriate position in the electrical testing equipment 100.

Figure 4:
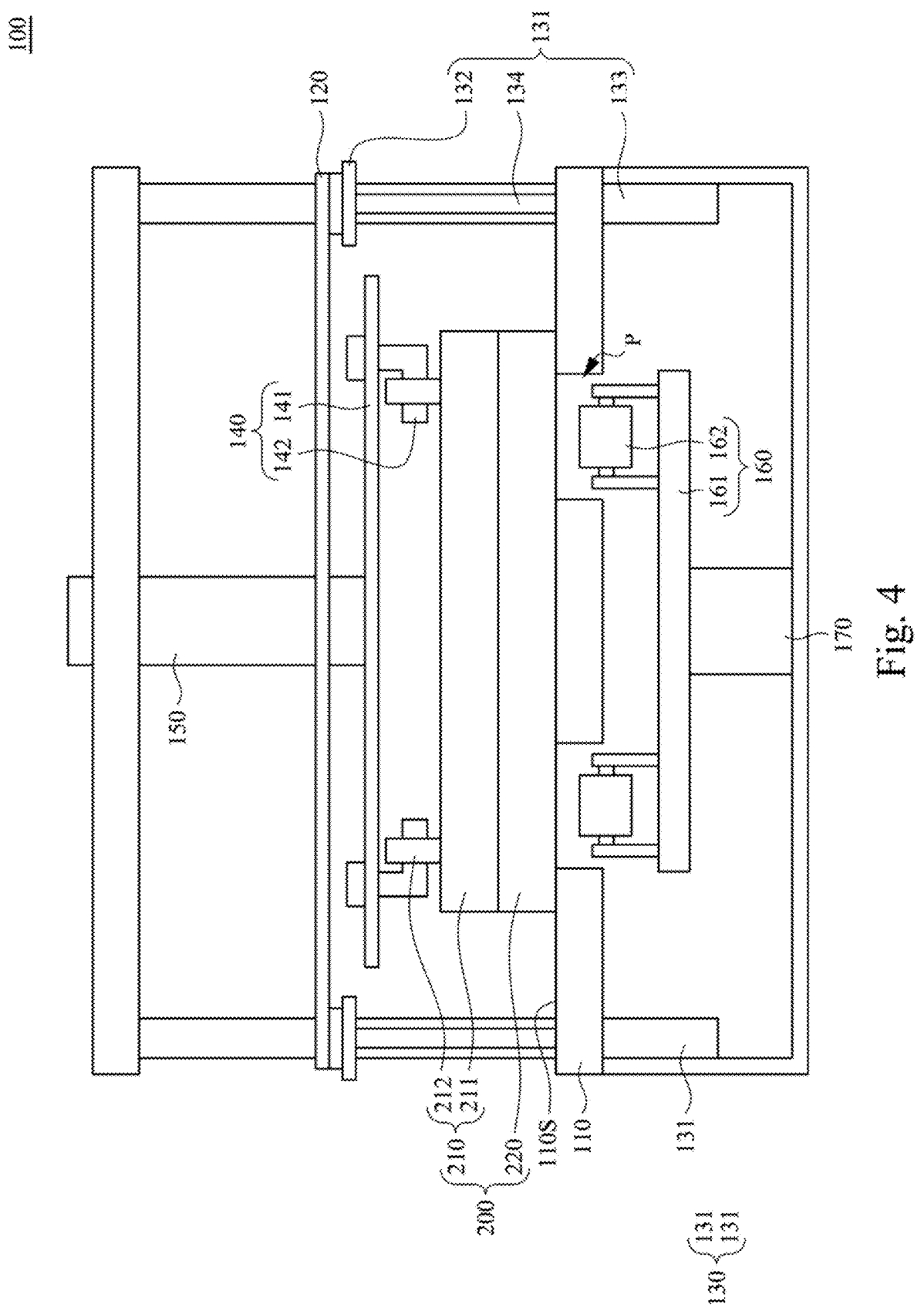
FIG. 4 is a front view of the electrical testing equipment of FIG. 1, in which the supporting surface supports the fixture assembly.

Reference is made to FIG. 4. FIG. 4 is a front view of the electrical testing equipment 100 of FIG. 1, in which the supporting surface 110S supports the fixture assembly 200. In this embodiment, as shown in FIG. 4, after the fixture assembly 200 is located at the appropriate position in the electrical testing equipment 100, the third moving device 170 moves the base 161 relative to the machine 110, such that the rollers 162 are retracted into the supporting surface 110S of the machine 110, and the fixture assembly 200 contacts with the supporting surface 110S and is supported by the supporting surface 110S.

In addition, as shown in FIGS. 1 and 4, the electrical testing equipment 100 further includes a clamping device 140 and a second moving device 150. The clamping device 140 is configured to clamp the upper fixture 210 of the fixture assembly 200. The second moving device 150 is connected with the machine 110 and the clamping device 140. The second moving device 150 is configured to move the clamping device 140 relative to the machine 110, such that the clamping device 140 is moved close to or away from the lower fixture 220.

Moreover, as shown in FIGS. 1 and 4, the upper fixture 210 includes a fixture body 211 and a plurality of first snapping portions 212. The first snapping portions 212 are disposed on the fixture body 211. To be specific, when the upper fixture 210 and the lower fixture 220 are combined, the highest point of the first snapping portions 212 and the lowest point of the lower fixture 220 define the height H mentioned above. Correspondingly, the clamping device 140 includes a device body 141 and a plurality of second snapping portions 142. The second snapping portions 142 are movably connected with the device body 141 and configured to snap with the first snapping portions 212 of the upper fixture 210. As shown in FIG. 1, the clamping device 140 is not yet moved to the upper fixture 210. As shown in FIG. 4, the clamping device 140 is moved to the upper fixture 210, while the second snapping portions 142 are moved relative to the device body 141 and snapped with the first snapping portions 212 of the upper fixture 210.

Figure 5:
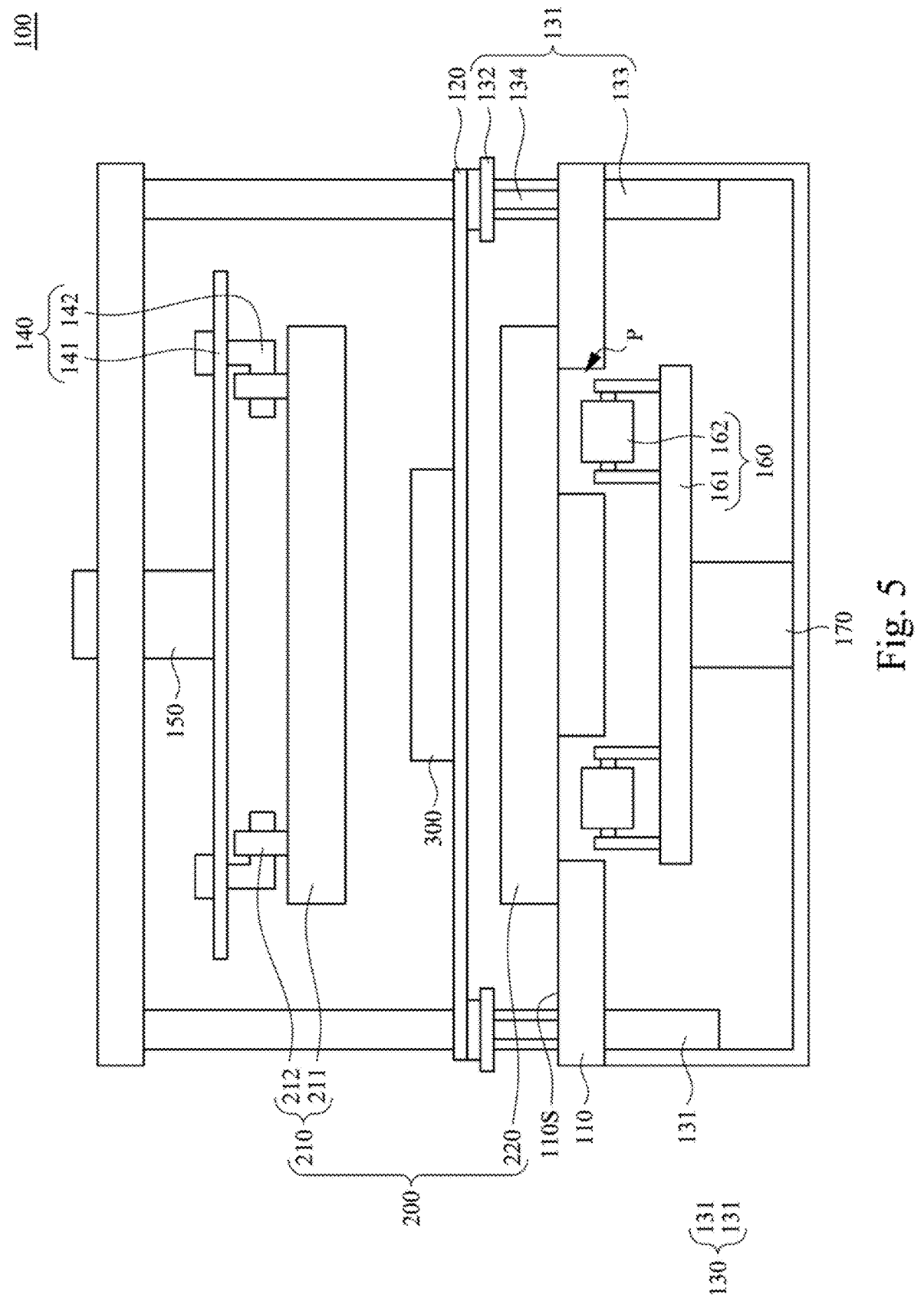
FIG. 5 is a front view of the electrical testing equipment of FIG. 4, in which the upper fixture is moved away from the lower fixture, and the conveyor rails are at least partially located between the upper fixture and the lower fixture.

Reference is made to FIG. 5. FIG. 5 is a front view of the electrical testing equipment 100 of FIG. 4, in which the upper fixture 210 is moved away from the lower fixture 220, and the conveyor rails 120 are at least partially located between the upper fixture 210 and the lower fixture 220. In this embodiment, as shown in FIG. 5, the second moving device 150 moves the clamping device 140 together with the upper fixture 210 away from the lower fixture 220. At this point, the first moving device 130 moves the conveyor rails 120 relative to the machine 110, such that the conveyor rails 120 are at least partially located between the upper fixture 210 and the lower fixture 220. Afterwards, the device under test 300 delivered to the conveyor rails 120 from the previous working station can be transferred to the lower fixture 220 from the conveyor rails 120 through the operational mechanism (not shown) of the lower fixture 220, such that the upper fixture 210 and the lower fixture 220 can sandwich the device under test 300 therebetween for subsequent electrical tests.

In conclusion, the aforementioned embodiments of the present disclosure have at least the following advantages:

(1) When the conveyor rails are moved relative to the machine and the distance between the conveyor rails and the supporting surface reaches the maximum value, the upper fixture and the lower fixture can, in the form of combination as a whole, pass between the conveyor rails and the supporting surface by using a trolley, and be placed on the supporting surface of the machine. Apart from increasing the efficiency to place the fixture assembly to the electrical testing equipment, the chance of misplacement occurred in general practice of placing the upper fixture after the lower fixture is firstly placed can be avoided.

(2) When placing the fixture assembly to the electrical testing equipment, the fixture assembly is firstly supported by the rollers protruding out of the supporting surface, and the fixture assembly does not contact with the supporting surface of the machine at this point. Under this condition, even if the fixture assembly including the upper fixture and the lower fixture has a relatively heavier weight, through the rotation of the rollers, a user can still easily push the fixture assembly to an appropriate position in the electrical testing equipment.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. An electrical testing equipment, comprising:
a machine having a supporting surface, the supporting surface being configured to support a fixture assembly;
a pair of conveyor rails configured to deliver a device under test, the conveyor rails being separated from the supporting surface by a distance; and
a first moving device disposed on the machine and comprising two subsidiary moving devices, the subsidiary moving devices being connected with two opposite ends of each of the conveyor rails and configured to move the conveyor rails relative to the machine to change the distance, each of the subsidiary moving devices comprising:
a supporting portion, the conveyor rails being disposed on the supporting portion;
a driving portion connected with the machine;
a moving rod connected between the driving portion and the supporting portion, the driving portion being configured to move the moving rod, such that the supporting portion is moved close to or away from the supporting surface;
at least one fixing portion connected with the machine; and
at least one guiding rod connected with the supporting portion and slidably connected with the fixing portion, the guiding rod being parallel with the moving rod.

2. The electrical testing equipment of claim 1, wherein a quantity of the guiding rod of each of the subsidiary moving devices is four.

3. The electrical testing equipment of claim 1, wherein the fixture assembly has a height, a maximum value of the distance is larger than the height.

4. The electrical testing equipment of claim 1, wherein the fixture assembly comprises an upper fixture and a lower fixture, the upper fixture is detachably connected with the lower fixture, the lower fixture is located between the upper fixture and the supporting surface, the upper fixture and the lower fixture are configured to sandwich the device under test therebetween.

5. The electrical testing equipment of claim 4, further comprising:
a clamping device configured to clamp the upper fixture; and
a second moving device connected with the machine and the clamping device, the second moving device being configured to move the clamping device relative to the machine, such that the clamping device is moved close to or away from the lower fixture.

6. The electrical testing equipment of claim 5, wherein the upper fixture comprises a fixture body and a plurality of first snapping portions, the first snapping portions are disposed on the fixture body, the clamping device comprises a device body and a plurality of second snapping portions, the second snapping portions are movably connected with the device body and configured to snap with the first snapping portions.

7. The electrical testing equipment of claim 1, wherein the first moving device is configured to move the conveyor rails perpendicularly relative to the supporting surface.

8. The electrical testing equipment of claim 1, wherein the machine has at least one through hole, the through hole is located on the supporting surface, the electrical testing equipment further comprises:
at least one roller assembly comprising a base and a plurality of rollers, the rollers are rotatably connected with the base respectively; and
a third moving device disposed on the machine and connected with the base, the third moving device is configured to move the base relative to the machine, such that the rollers at least partially pass through the through hole and protrude out of the supporting surface.

9. An electrical testing equipment, comprising:
a machine having a supporting surface and at least one through hole located on the supporting surface;
at least one roller assembly comprising a base and a plurality of rollers, each of the rollers being connected with the base and configured to rotate about an axis relative to the base, the base being movably connected with the machine such that the rollers can be at least partially protruded out of the supporting surface or retracted into the supporting surface through the through hole; and
a pair of conveyor rails configured to deliver a device under test, the conveyor rails being movable relative to the supporting surface, each of the conveyor rails extending along a direction parallel with the axes.

10. The electrical testing equipment of claim 9, further comprising:

a first moving device connected between the machine and the conveyor rails, the first moving device being configured to move the conveyor rails close to or away from the machine.

11. The electrical testing equipment of claim 9, further comprising:

a fixture assembly configured to pass between the conveyor rails and supporting surface, and configured to be supported by one of the rollers and the supporting surface, the fixture assembly being further configured to hold the device under test therein.

12. The electrical testing equipment of claim 11, wherein the fixture assembly comprises an upper vacuum fixture and a lower vacuum fixture, the upper vacuum fixture is detachably connected with the lower vacuum fixture, the lower vacuum fixture is located between the upper vacuum fixture and the supporting surface, the upper vacuum fixture and the lower vacuum fixture are configured to sandwich the device under test therebetween.

13. The electrical testing equipment of claim 12, further comprising:

a clamping device configured to clamp the upper vacuum fixture; and a second moving device connected with the machine and the clamping device, the second moving device being configured to move the clamping device relative to the machine, such that the clamping device is moved close to or away from the lower vacuum fixture.

14. The electrical testing equipment of claim 13, wherein the upper vacuum fixture comprises a fixture body and a plurality of first snapping portions, the first snapping portions are disposed on the fixture body, the clamping device comprises a device body and a plurality of second snapping portions, the second snapping portions are movably connected with the device body and configured to snap with the first snapping portions.

* * * * *